(12) United States Patent
Valliappan et al.

(10) Patent No.: US 11,689,395 B2
(45) Date of Patent: Jun. 27, 2023

(54) EFFICIENT ARCHITECTURE FOR HIGH-PERFORMANCE DSP-BASED SERDES

(71) Applicant: Avago Technologies International Sales Pte. Limited, Singapore (SG)

(72) Inventors: Magesh Valliappan, Austin, TX (US); Adam Benjamin Healey, Newburyport, MA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/499,826

(22) Filed: Oct. 12, 2021

(65) Prior Publication Data

US 2023/0110475 A1    Apr. 13, 2023

(51) Int. Cl.
  *H04L 25/03*   (2006.01)
  *H03M 1/34*    (2006.01)
  *H03M 1/10*    (2006.01)

(52) U.S. Cl.
  CPC .... *H04L 25/03343* (2013.01); *H03M 1/1009* (2013.01); *H03M 1/34* (2013.01); *H04L 25/03267* (2013.01); *H04L 2025/03477* (2013.01)

(58) Field of Classification Search
  CPC ... H04B 1/16; H04B 1/40; H04B 3/23; H04B 3/32; H04B 10/69; H04B 10/2507; H04B 10/25133; H04B 10/697; H03L 7/0807; H03L 7/093; H03L 7/07; H03L 7/0814; H03L 7/099; H03L 2207/06; H03L 7/1976; H03L 7/23; H03L 7/081; H04L 25/03057; H04L 25/03885; H04L 27/01; H04L 7/0062; H04L 25/03878; H04L 2025/0349; H04L 7/033; H04L 25/03343
  USPC ........................................................ 375/232
  See application file for complete search history.

(56) References Cited

U.S. PATENT DOCUMENTS

| | | | |
|---|---|---|---|
| 7,706,492 B2 * | 4/2010 | Yen ....................... | H04L 7/0062 375/354 |
| 10,880,130 B1 * | 12/2020 | Hidaka ............... | H04L 25/0278 |
| 11,177,986 B1 * | 11/2021 | Ganesan ........... | H04L 25/03878 |
| 2003/0182619 A1 | 9/2003 | Greiss et al. | |
| 2011/0142120 A1 * | 6/2011 | Liu ................... | H04L 25/03885 375/233 |
| 2015/0016497 A1 | 1/2015 | Aziz et al. | |
| 2017/0257168 A1 | 9/2017 | Gopalakrishnan et al. | |
| 2021/0288656 A1 | 9/2021 | Ganesan et al. | |
| 2021/0336761 A1 * | 10/2021 | Smith .................. | H04L 7/0029 |

OTHER PUBLICATIONS

European Search Report on EP 22200728.8 dated Feb. 17, 2023.
Pisati Matteo et al. "A 243-mW 1.25-56-GB/s Continous Range PAM-4 42.5-dB IL ADC/DAC-Based Transceiver in 7-nm FinFET", IEEE Journal of Solid-State Circuits, IEEE, USA, vol. 55, No. 1, Jan. 1, 2020, pp. 6-18.

* cited by examiner

*Primary Examiner* — Eva Y Puente
(74) *Attorney, Agent, or Firm* — Foley & Lardner LLP (57) ABSTRACT

A digital signal processing (DSP) device includes a first filter to equalize channel dispersion associated with signal transmission through a medium, a second filter to cancel channel reflections, and a third filter to at least reduce noise. The DSP device is a receiver DSP of the SERDES.

20 Claims, 5 Drawing Sheets

EFFICIENT ARCHITECTURE FOR HIGH-PERFORMANCE DSP-BASED SERDES

TECHNICAL FIELD

The present description relates generally to high-speed serial communications links and, in particular, to an efficient architecture for a high-performance digital signal processing (DSP)-based serializer deserializer (SERDES).

BACKGROUND

High speed digital signal processing (DSP)-based serializer deserializers (SERDES) require sophisticated algorithms to operate over densely-populated and low-cost channels while maintaining high efficiency to reduce power usage and chip area. This is particularly true in highly integrated large application-specific integrated circuit (ASIC) applications. Conventional DSP receivers can have a long feed-forward equalizer (FFE) and a short 1-2 tap decision-feedback equalizer (DFE). Practical channels have reflections that need equalization at long delays, which in turn drive an increase in the FFE length. The input to the FFE usually has attenuated high-frequency content requiting more active taps to equalize a reflection. These factors increase power and area of the DSP. The complexity of these circuits results in longer latencies to obtain timing-related information such as received symbols and expected values to compare against, causing a loss of margin in highly integrated environments where tolerance to jitter is required. Sometimes a separate, shorter FFE, is dedicated to the timing recovery path to achieve reasonable, but sub-optimal signal quality, with lower latency. This approach, however, can add redundancy and complexity. A low-power, low-area architecture with reflection-cancellation and fast-timing recovery, while still retaining FFE-DFE-like noise shaping, is desired for low bit-error-rate applications.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

The subject technology is directed to an efficient architecture for a high performance digital signal processing (DSP)-based serializer deserializer (SERDES). The disclosed technology provides a low-power, low-area architecture with reflection-cancellation and fast-timing recovery, while retaining feed-forward equalizer (FFE) and decision-feedback equalizer (DFE) like noise shaping for low bit-error-rate (BER) applications. Instead of a single stage FFE, the disclosed solution implements the FFE as a cascaded combination of three filters and an optional interpolator. In some implementations, the three filters include a receive (RX)-FFE filter, a reflection canceller (RC)-finite impulse-response (FIR) filter and a noise-shaping programmable-response (PR) FIR filter.

The short RX-FFE filter, implemented at low latency, targets a unit tap equalized response. The equalized response has less dynamic range across channels and allows more aggressive bit-width reduction for downstream stages. The short RX-FFE filter output is provided for timing recovery and can be readily sliced into symbols' expected values and provides a low-latency timing error for clock-and-delay recovery (CDR) without the implementation delays of a long FFE or DFE. The output is also quantized and used as the input to a floating tap structure to cancel reflections. This signal is already equalized by the RX FFE, resulting in fewer active taps to cancel reflections. The quantized input has a narrow bit width resulting in low-cost delay lines and trivial multipliers that leads to low overall power and chip area. To obtain the benefit of noise shaping, RX FFE output is passed through a noise shaping filter and DFE fixes inter-symbol interference (ISI). To obtain an even faster timing-recovery, an interpolator can be inserted at the FFE output. The interpolator operates on a well-equalized input resulting in cost savings in bit resolutions for associated multipliers while still retaining all other capabilities.

Figure 1:
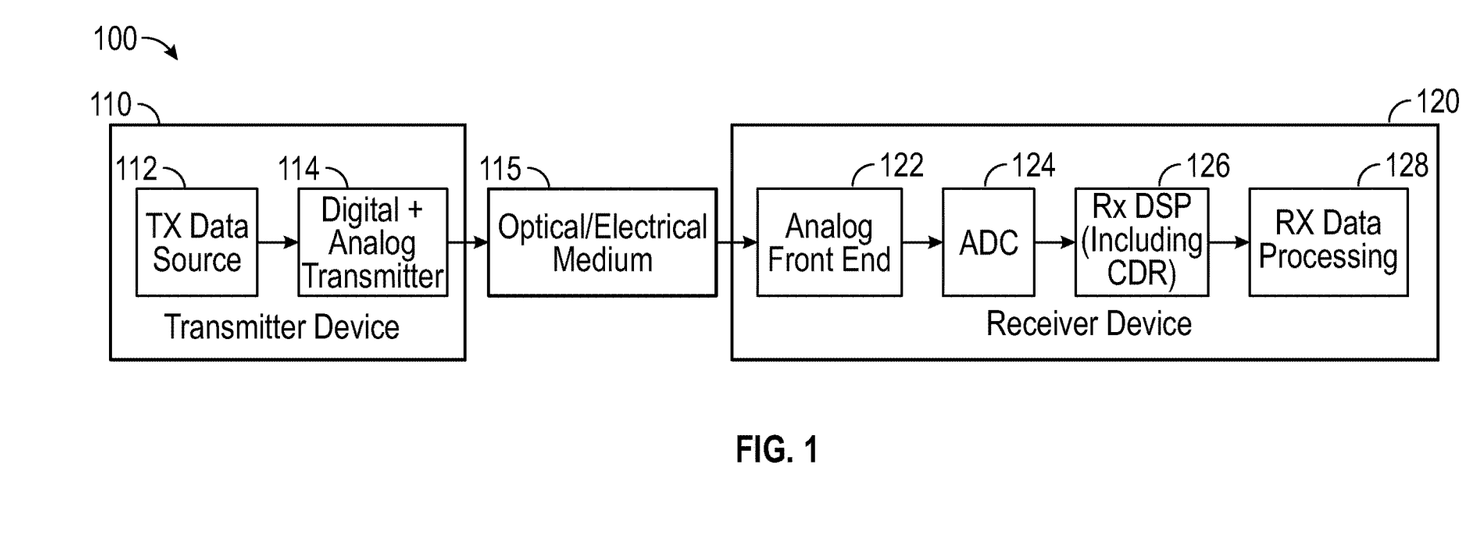
FIG. 1 is a block diagram illustrating an example of a serializer deserializer (SERDES) link within which the high-performance digital signal processing (DSP) of the subject technology is implemented.

FIG. 1 is a block diagram illustrating an example of a SERDES link 100 within which the high-performance DSP of the subject technology is implemented. The SERDES link 100 includes a transmitter device 110, a transmission medium 115 and a receiver device 120. The transmitter device 110 includes a transmit (TX) data source 112 and a transmitter circuit 114. The TX data source provides data such as electrical or optical data to be transmitted to the receiver device 120. The transmitter circuit 114 includes digital and analog circuitry suitable for processing the data, such as amplifying and noise cancelling to prepare the data for transmission over the transmission medium 115. In some implementations, the transmitter circuit 114 may also include electro-optical circuitry. The transmission medium 115 can be an optical transmission medium consisting of optical fibers and fiber optics components or an electrical transmission medium consisting of twisted wires or coaxial cables and associated electrical circuitry.

The receiver device 120 includes an analog front-end (AFE) circuit 122, an analog-to-digital converter (ADC) circuit 124, a receiver (RX) DSP block 126 and a RX data processing block 128. The AFE circuit 122 may include low-noise amplifiers, filters and adjustable gain amplifiers and is responsible for amplification and noise reduction of the analog signal received from the transmission medium 115. The ADC circuit 124 converts the analog output signals of the AFE circuit 122 into digital signals that can be processed by the RX DSP block 126. The last stage is the RX data processing block 128 that further processes the output data from the RX DSP block 126 to recover the original data for presentation on an output device, for example, for display on a display device. In some implementations, the SERDES link 100 may include an optional forward error correction (FEC) block (not shown for simplicity) that can be implemented in the transmitter device 110 (e.g., in the TX data source 112) or the receiver device 120 (e.g., the RX data processing block 128). The SERDES link 100 shows TX and RX in only one direction. A similar link can be used in the opposite direction, The RX DSP block 126 is the foundation of the receiver device 120 for which the subject technology provides efficient implementation architectures, as discussed herein.

Figure 2:
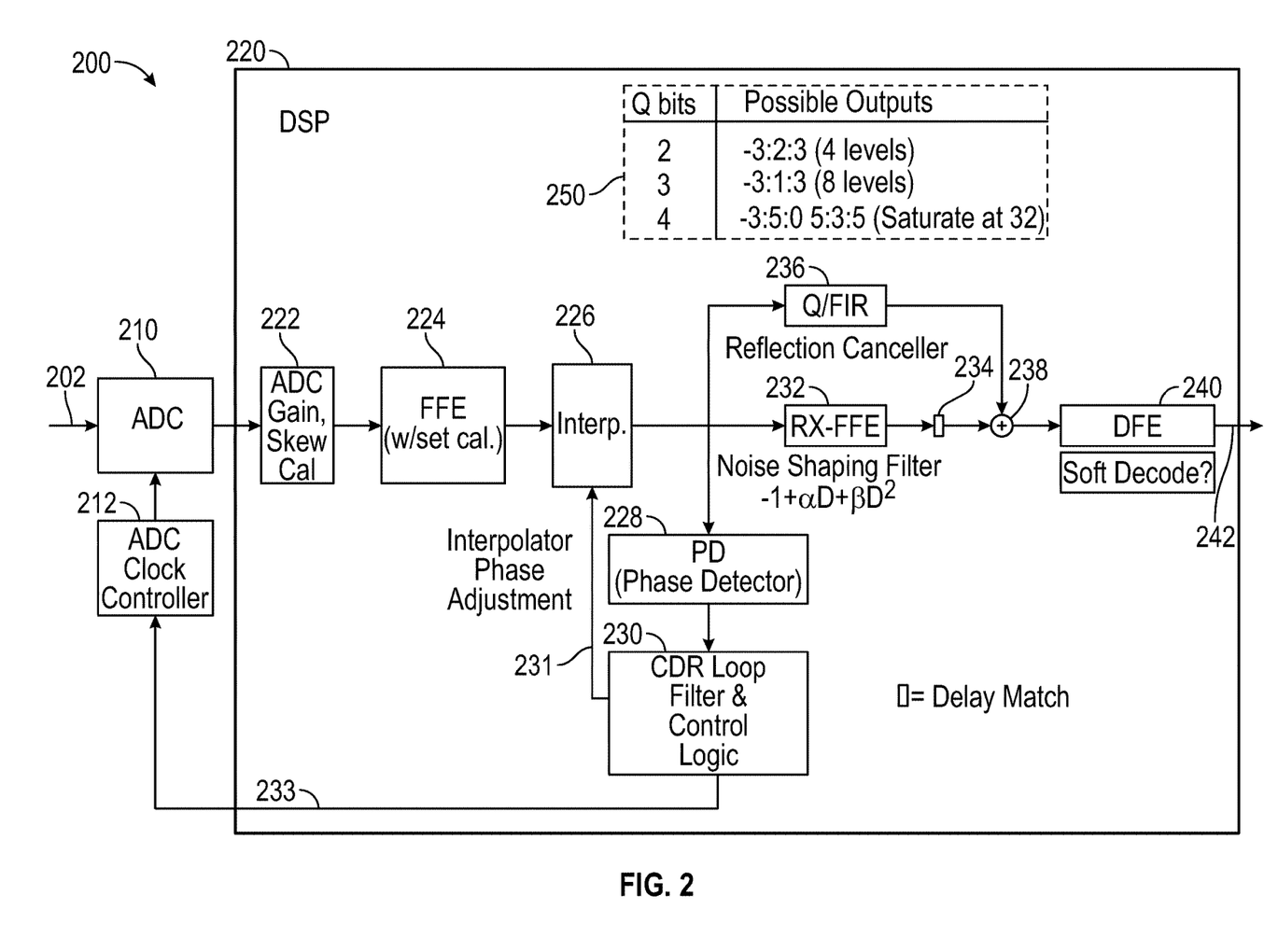
FIG. 2 is a block diagram illustrating an example of a high-performance DSP system, according to various aspects of the subject technology.

FIG. 2 is a block diagram illustrating an example of a high-performance DSP system 200, according to various aspects of the subject technology. The high-performance DSP system 200 includes a DSP device 220, an ADC 210 and an ADC clock controller 212. The ADC 210 is similar to the ADC circuit 124 of FIG. 1 and can receive analog data 202 from an AFE circuit (e.g., 122 of FIG. 1) and convert it to digital data for processing by the DSP system 200. The ADC clock controller 212 provides and controls the clock signals for the ADC 210.

The DSP device 220 includes an ADC calibration circuit 222, and FFE circuit 224, an interpolator 226, a phase detector (PD) 228, a CDR circuit 230 and RX FFE circuit 232, a delay-match circuit 234, a reflection canceller 236, a summing circuit 238 and a DFE circuit 240. In some implementations, some components of the DSP device 220 can be implemented in software and/or firmware. The ADC calibration circuit 222 can be a gain-skew calibration circuit and is responsible for calibration of the timing offset (skew) and gain errors of the ADC 210. The FFE circuit 224 is an equalizer that is used to undo the channel dispersion associated with the transmission medium (e.g., 115 of FIG. 1) and may include offset calibration. The FFE circuit 224 can be implemented as a symbol-spaced FIR filter to reduce distortions due to, for example, channel loss impairments. In some aspects, the FFE circuit 224 can be implemented using multitap filters that create a number of delayed versions of the input signal that are added back to the signal with the proper weights. In some implementations, the FFE circuit 224 can include offset calibration to calibrate for a timing or voltage offset of the digital signal received from the ADC calibration circuit 222. A benefit of the proposed architecture (e.g., where the CDR circuit 230 derives its input from the FFE 226) is that the timing or voltage offsets can be corrected in both the FFE and CDR path, unlike the prior solutions that may have a dedicated stage between the ADC and (CDR+FFE). The interpolator 226 is an important part of the DSP device 220 and allows the receiver to adjust the phase of its sampling clocks in very fine increments using a phase adjustment signal 231. The interpolator 226 helps to obtain a faster timing-recovery loop. The interpolator 226 operates on a well-equalized input resulting in cost savings in bit resolutions for associated multipliers while still retaining all other capabilities. In some aspects, the interpolator 226 can be a current-controlled phase interpolator or a voltage-controlled phase interpolator. The voltage-controlled interpolators can be less linear and more difficult to control because they require analog control inputs. The current-controlled interpolators may be larger and consume more power but use digital control signals and their outputs can be more linear. The PD 228 can detect the phase angle of the interpolator output signal and provide it to the CDR circuit 230. The CDR circuit 230 may include a loop filter and control logic and generates interpolator phase adjustment signal 231 and control signal 233 that is used by the ADC clock controller 212.

The output of the interpolator 226 includes the original signal transmitted by the transmitter device (e.g., 110 of FIG. 1) plus the edge reflection effect due to the transmission medium (e.g., 115 of FIG. 1) and is ready for undoing the edge reflection effect by the next stage, including the RX-FFE 232 and the reflection canceller 236. The RX-FFE, 232 is a short equalizer implemented at low latency and can target a partial response for noise shaping. The RX-FFE 232 includes a noise-shaping filter that can change the spectral shape of a signal and can be characterized by a polynomial transfer function similar to $1+\alpha D+\beta D^2$, where D is a delay or latency variable and $\alpha$ and $\beta$ are parameters of the transfer function. The value of $\alpha$ is typically between 0 and 1 to implement a low-pass filter to reduce noise. The reflection canceller 236 consists of a quantizer (Q) followed by an FIR filter (also referred to as Q-FIR filter) with a floating tap structure. The quantized input to the FIR has a narrow bit width resulting in low-cost delay lines and simple multipliers that leads to low overall power usage and chip area. In other words, the use of the Q filter in front of the FIR filter allows using an FIR with a lower number of bits, for which possible outputs for different values (2, 3 and 4) of a Q bit is given in a table 250. The reflection canceller 236 can effectively cancel the effect of the channel impairments such as reflection signals that can occur when a signal is transmitted along the transmission medium (e.g., 115 of FIG. 1). The output signal from the RX-FFE 232 is delayed by the delay match circuit 234 and combined by the summing circuit 238 with the signal output of the reflection canceller 236 for timing recovery. The delay match 234 accounts for the difference between the processing delays of the Q/FIR 236 and RX-FFE 232 paths so that the output of the summing circuit 238 is correct. The output signal from the summing circuit 238 is passed into a DEE circuit 240, which is a noise-shaping filter for suppression of quantization noise. DFE circuit 240 subtracts the terms $\alpha D+\beta D^2$ introduced by the RX-FFE using estimates of the transmitted symbols derived from the signal at its input. In this way the noise shaping benefits of the RX-FFE are realized without the penalty of the inter-symbol interference it introduces. The DSP output signal 242 is a signal in which the channel dispersion and reflection effects are undone. The DSP output signal is sent to an RX data processing circuit (e.g., 128 of FIG. 1) to recover the original data transmitted by the transmitter device (e.g., 110 of FIG. 1).

Figure 3:
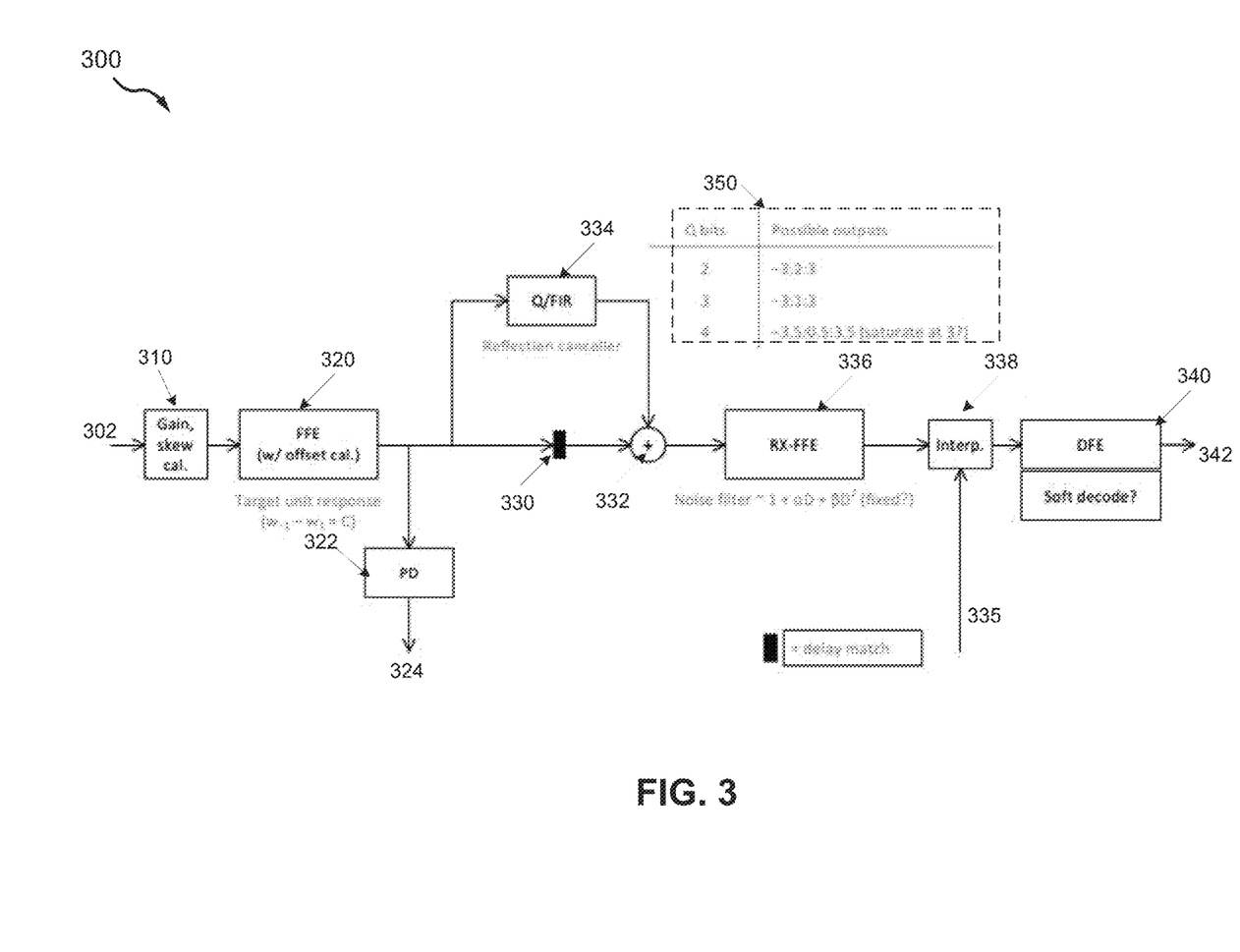
FIG. 3 is a block diagram illustrating an example of a high-performance DSP system, according to various aspects of the subject technology.

FIG. 3 is a block diagram illustrating an example of a high-performance DSP device 300, according to various aspects of the subject technology. The DSP device 300 includes an ADC calibration circuit 310, and FFE circuit 320, a PD 322, a delay-match circuit 330, a reflection canceller 334, a summing circuit 332, an RX-FFE 336, an interpolator 338 and a DFE circuit 340. In some implementations, some components of the DSP device 300 can be implemented in software and/or firmware. The ADC calibration circuit 310 can be a gain-skew calibration circuit and is responsible for calibration of the timing offset and gain errors of the ADC 210. The FFE circuit 320 is a passive equalizer used to undo the channel dispersion and may include offset calibration. The FFE circuit 320 can be implemented as a symbol-spaced FIR filter to reduce distortions due to, for example, channel loss impairments. In some aspects, the FFE circuit 320 can be implemented using multitap filters that create a number of delayed versions of the input signal that are added back to the signal with the proper weights. In some implementations, the FFE circuit 320 can include offset calibration to calibrate for a timing offset of the digital signal received from the ADC calibration circuit 310. The PD 322 can detect the phase angle signal 324 associated with the output signal from the FFE circuit 320. The phase angle signal 324 can be provided to a CDR circuit (e.g., 230 of FIG. 2).

The output of the FFE 320 includes the original signal transmitted by the transmitter device (e.g., 110 of FIG. 1) plus the edge reflection effect due to the transmission medium (e.g., 115 of FIG. 1) that has to be canceled. The reflection canceller 334 consists of a Q filter followed by an FIR filter with a floating tap structure and is similar to the reflection canceller 236 of FIG. 2. The quantized input to the FIR filter has a narrow bit width resulting in low-cost delay lines and simple multipliers that leads to low overall power and chip area. In other words, the use of the Q filter in front of the FIR filter (also referred to as Q-FIR filter) allows using an FIR with a lower number of bits, for which possible outputs for different values (2, 3 and 4) of a Q bit is given in a table 350. The delay match 330 accounts for the processing delays of the reflection canceller 334 so that the output of the summing circuit 332 is correct. The output of the delay-match circuit 330 is combined with an output of the reflection canceller 334 by the summing circuit 332. The output signal from the summing circuit 332 is passed into the RX-FFE 336, which is similar to the RX-FFE 232 of FIG. 2, as discussed above. For example, the RX-FFE 336 similarly includes a noise-shaping filter that can change the spectral shape of signal and can be characterized by a polynomial transfer function: $1+\alpha D+\beta D^2$, where is a delay or latency variable and $\alpha$ and $\beta$ are parameters of the transfer function. The value of $\alpha$ is typically between 0 and 1 to implement a low-pass filter to reduce noise. The output of the RX-FFE 336 is passed to an interpolator 338 that can help to achieve a faster timing-recovery. The interpolator 338 can use a phase adjustment signal 335, for example, provided by a CDR circuit (e.g., 230 of FIG. 2). The output of the interpolator 338 is sent to the DFE circuit 340, which is a noise-shaping filter for suppression of quantization noise and has a transfer function similar to that of DFE circuit 240 of FIG. 2, as discussed above. The output of the DSP device 300 is a signal in which the effects of the channel dispersion and reflection are canceled and is sent to an RX data processing circuit (e.g., 128 of FIG. 1) to recover the original data transmitted by the transmitter device (e.g., 110 of FIG. 1).

Figure 4:
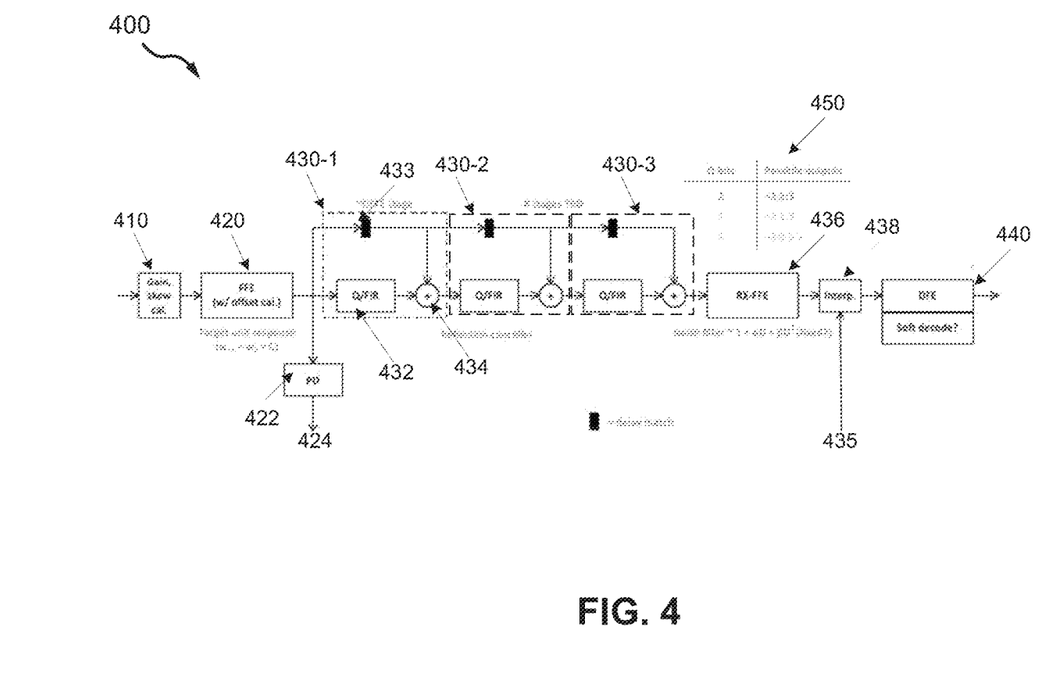
FIG. 4 is a block diagram illustrating an example of a high-performance DSP system, according to various aspects of the subject technology.

FIG. 4 is a block diagram illustrating an example of a high-performance DSP, according to various aspects of the subject technology. The DSP device 400 includes an ADC calibration circuit 410, and FFE circuit 420, a PD 422, a number of (e.g., three) refection canceller stages 430 (430-1, 430-2 and 430-3), an RX-FFE circuit 436, an interpolator 438 and a DFE circuit 440. In some implementations, some components of the DSP device 400 can be implemented in software and/or firmware. The ADC calibration circuit 410 can be a gain-skew calibration circuit and is responsible for calibration of the timing offset and gain errors of the ADC (e.g., 210 of FIG. 2). The FFE circuit 420 is a passive equalizer used to undo the channel dispersion and may include offset calibration. The FFE circuit 420 can be implemented as a symbol-spaced FIR filter to reduce distortions due to, for example, channel loss impairments. In some aspects, the FFE circuit 420 can be implemented using multitap filters that create a number of delayed versions of the input signal that are added back to the signal with the proper weights. In some implementations, the FFE circuit 420 can include offset calibration to calibrate for a timing offset of the digital signal received from the ADC calibration circuit 410. The PD 422 can detect the phase angle signal 424 associated with the output signal from the FEE circuit 420. The phase angle signal 424 can be provided to a CDR circuit (e.g., 230 of FIG. 2).

The output of the FFE circuit 420 includes the original signal transmitted by the transmitter device 110 of FIG. 1) plus the edge reflection effect due to the transmission medium (e.g., 115 of FIG. 1) that has to be canceled. The reflection canceller stages 430 can cancel the edge reflection effect. Each of the reflection canceller stages 430 consists of a Q-FIR filter 432, a delay match 433 and a summing circuit 434, as described above with respect to FIG. 2. The delay match 433 accounts for the delay of the Q/FIR filters 432 so that outputs of the reflection canceller stages 430 are correct. The purpose of using multiple reflection canceller stages 430 is to provide an implementation of an iterative reflection cancellation algorithm. In general, the output of the first Q/FIR filter 432 is a rougher estimate of the reflection, which is used as an input to the second Q/FIR stage. The estimate of the reflection from the second Q/FIR is expected to be a better estimate of the reflection (better performance) and so on. There will be a point beyond which the estimates get no better or "converge". Three stages are shown as a balance between the quality of the estimate of the reflection and the complexity of reflection canceller stages 430. More or fewer stages are also possible. The output signal from the reflection canceller stages 430 is passed into the RX-FFE circuit 436, which is similar to the RX-FFE 232 of FIG. 2, as discussed above. For example, the RX-FFE circuit 436 similarly includes a noise-shaping filter that can change the spectral shape of signal and can be characterized by a polynomial transfer function: $1+\alpha D+\beta D^2$, where D is a delay or latency variable and $\alpha$ and $\beta$ are parameters of the transfer function. The value of $\alpha$ is typically between 0 and 1 to implement a low-pass filter to reduce noise. The output of the RX-FFE circuit 436 is passed to an interpolator 438 that can help to achieve a faster timing-recovery. The interpolator 438 can use a phase adjustment signal 435, for example, provided by a CDR circuit (e.g., 230 of FIG. 2). The output of the interpolator 438 is sent to the DFE circuit 440, which is a noise-shaping filter for suppression of quantization noise and has a transfer function similar to that of DFE circuit 240 of FIG. 2, as discussed above. The output of the DSP device 400 is a signal in which the effects of the channel dispersion and reflection are canceled and the signal is sent to an RX data processing circuit (e.g., 128 of FIG. 1) to recover the original data transmitted by the transmitter device (e.g., 110 of FIG. 1).

Figure 5:
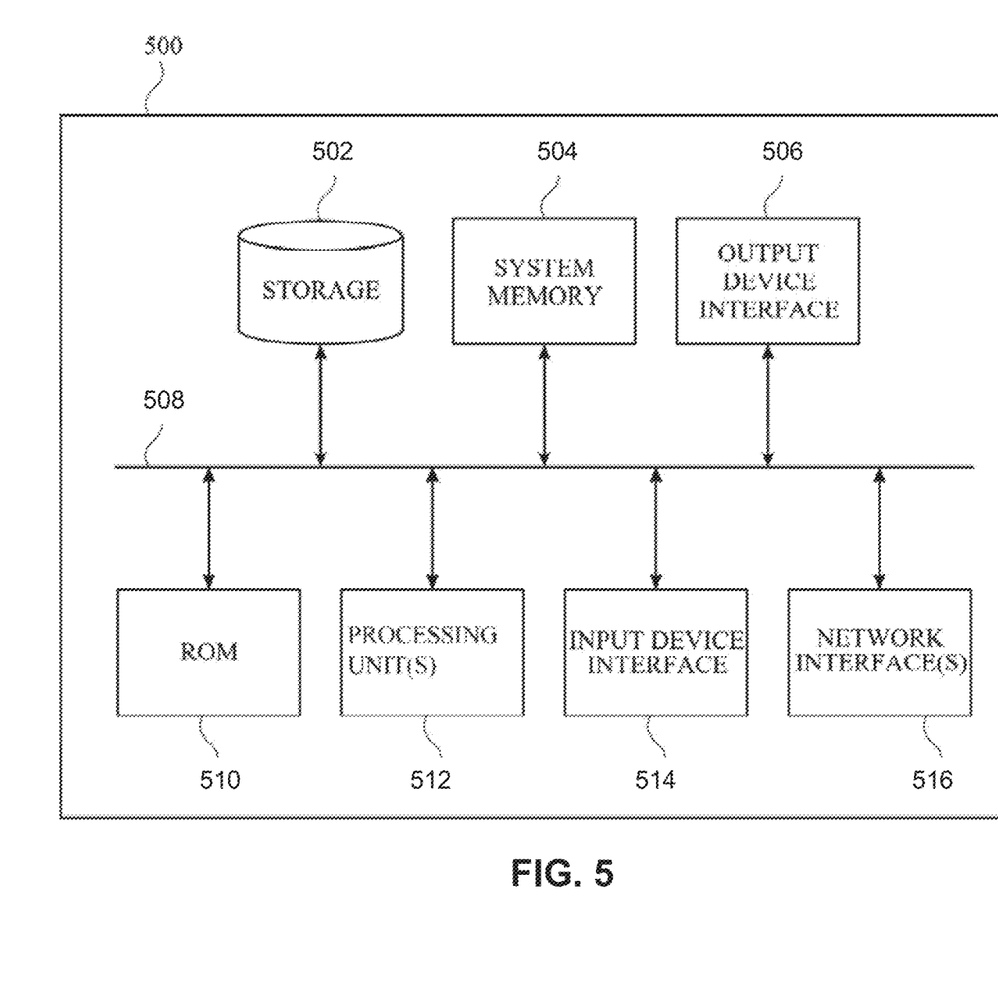
FIG. 5 is an electronic system within which some aspects of the subject technology are implemented.

FIG. 5 is an electronic system within which some aspects of the subject technology are implemented. The electronic system 500 can be, and/or can be a part of, the network switch of a data center or an enterprise network. The electronic system 500 may include various types of computer readable media and interfaces for various other types of computer readable media. The electronic system 500 includes a bus 508, one or more processing unit(s) 512, a system memory 504 (and/or buffer), a ROM 510, a permanent storage device 502, an input device interface 514, an output device interface 506, and one or more network interfaces 516, or subsets and variations thereof.

The bus 508 collectively represents all system, peripheral, and chipset buses that communicatively connect the numerous internal devices of the electronic system 500. In one or more implementations, the bus 508 communicatively connects the one or more processing unit(s) 512 with the ROM 510, the system memory 504, and the permanent storage device 502. From these various memory units, the one or more processing unit(s) 512 retrieves instructions to execute and data to process in order to execute the processes of the subject disclosure. The one or more processing unit(s) 512 can be a single processor or a multi-core processor in different implementations. In one or more aspects, the one or more processing unit(s) 512 may execute software components of the subject technology.

The ROM 510 stores static data and instructions that are needed by the one or more processing unit(s) 512 and other modules of the electronic system 500. The permanent storage device 502, on the other hand, may be a read-and-write memory device. The permanent storage device 502 may be a nonvolatile memory unit that stores instructions and data even when the electronic system 500 is off. In one or more implementations, a mass-storage device (such as a magnetic or optical disk and its corresponding disk drive) may be used as the permanent storage device 502.

In one or more implementations, a removable storage device (such as a floppy disk, flash drive and its corresponding disk drive) may be used as the permanent storage device 502. Similar to the permanent storage device 502, the system memory 504 may be a read-and-write memory device. However, unlike the permanent storage device 502, the system memory 504 may be a volatile read-and-write memory, such as random access memory (RAM). The system memory 504 may store any of the instructions and data that one or more processing unit(s) 512 may need at runtime. In one or more implementations, the processes of the subject disclosure are stored in the system memory 504, the permanent storage device 502 and/or the ROM 510. From these various memory units, the one or more processing unit(s) 512 retrieves instructions to execute and data to process in order to execute the processes of one or more implementations.

The bus 508 also connects to the input and output device interfaces 514 and 506, The input device interface 514 enables a user to communicate information and select commands to the electronic system 500. Input devices that may be used with the input device interface 514 may include, for example, alphanumeric keyboards and pointing devices (also called "cursor control devices"). The output device interface 506 may enable, for example, the display of images generated by electronic system 500. Output devices that may be used with the output device interface 506 may include, for example, printers and display devices, such as a liquid crystal display a light emitting diode display, an organic light emitting diode display, a flexible display, a flat panel display, a solid state display, a projector or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech or tactile input.

Finally, as shown in FIG. 5, the bus 508 also couples the electronic system 500 to one or more networks and/or to one or more network nodes, through the one or more network interface(s) 516. In this manner, the electronic system 500 can be a part of a network of computers (such as a local area network, a wide area network, an intranet, or a network of networks, such as the internet). Any or all components of the electronic system 500 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be nontransitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG and Millipede memory.

Further, the computer-readable storage medium can include any nonsemiconductor memory, such as optical disk storage, magnetic disk storage, magnetic tape, other magnetic storage devices or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections or any combination thereof.

Instructions can be directly executable or can be used to develop executable instructions. For example, instructions can be realized as executable or nonexecutable machine code or as instructions in a high-level language that can be compiled to produce executable or nonexecutable machine code. Further, instructions also can be realized as or can include data. Computer-executable instructions also can be organized in any format, including routines, subroutines, programs, data structures, objects, modules, applications, applets and functions, etc. As recognized by those of skill in the art, details including, but not limited to, the number, structure, sequence, and organization of instructions can vary significantly without varying the underlying logic, function, processing and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Those of skill in the art would appreciate that the various illustrative blocks, modules, elements, components, methods and algorithms described herein may be implemented as electronic hardware, computer software or combinations of both. To illustrate this interchangeability of hardware and software, various illustrative blocks, modules, elements, components, methods and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that not all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B or only C; any combination of A, B and C; and/or at least one of each of A, B and C.

The predicate words "configured to," "operable to," and "programmed to" do not imply any particular tangible or intangible modification of a subject, but, rather, are intended to be used interchangeably. In one or more implementations, a processor configured to monitor and control an operation or a component ay also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure" and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have" or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A digital signal processing (DSP) device comprising:
    a first filter configured to equalize channel dispersion associated with signal transmission;
    a second filter configured to cancel channel reflections;
    a receiver DSP comprising a serializer deserializer (SERDES);
    an analog-to-digital converter (ADC); and
    an ADC calibration circuit configured to calibrate for a gain error and a timing offset of the ADC and to provide an input signal for the first filter.

2. The DSP device of claim 1, wherein the first filter comprises a first feed-forward equalizer (FFE) having an offset calibration, and wherein the first FFE is implemented in hardware.

3. The DSP device of claim 1, wherein the second filter comprises a quantizer and finite impulse-response (Q-FIR) filter, and wherein the Q-FIR filter is implemented in hardware.

4. The DSP device of claim 1, further comprising a receive-(RX-) FFE coupled to a delay-match circuit, wherein the RX-FFE and the delay-match circuit are implemented in parallel with the second filter, wherein the RX-FFE is configured to reduce noise in response to being used with a decision-feedback equalizer (DFE), and wherein a dispersion added by the RX-FFE is tuned for being removed by the DFE.

5. The DSP device of claim 4, further comprising a summing circuit configured to combine outputs of the delay-match circuit and the second filter and to generate a first output signal.

6. The DSP device of claim 5, further comprising a third filter configured to remove inter-symbol interference added by the RX-FFE.

7. The DSP device of claim 1, further comprising an interpolator configured to adjust a phase of an equalized input from the first filter using a phase adjustment signal.

8. The DSP device of claim 7, wherein the phase adjustment signal is generated by a clock and data recovery (CDR) circuit coupled to a phase detector (PD), wherein the PD is configured to detect a phase angle of an interpolator output signal.

9. The DSP device of claim 1, wherein the second filter comprises a plurality of reflection cancellation stages, and wherein each reflection cancellation stage of the plurality of reflection cancellation stages comprises a Q-FIR filter, a delay-match circuit and a summing circuit.

10. The DSP device of claim 9, wherein the second filter is coupled to a receive-(RX-) FFE circuit and an interpolator configured to adjust a phase of an RX-FFE output signal.

11. The DSP device of claim 1, wherein the ADC calibration circuit comprises a gain-skew calibration circuit.

12. A system comprising:
an analog-to-digital converter (ADC) configured to convert an analog signal from an analog front-end (AFE) circuit;
a first equalizer configured to equalize channel dispersion of a transmission medium coupled to the AFE circuit;
a reflection canceller configured to cancel channel reflections associated with the transmission medium; and
a receive-(RX-) FFE coupled to a delay-match circuit, wherein:
the AFE circuit is configured to receive analog signals transmitted by a serializer-deserializer (SERDES) transmitter through the transmission medium, and
the RX-FFE and the delay-match circuit are implemented in parallel with the reflection canceller.

13. The system of claim 12, wherein the first equalizer comprises a first feed-forward equalizer (FFE) having an offset calibration, and wherein the reflection canceller comprises a quantizer-finite impulse-response (Q-FIR) filter.

14. The system of claim 12, further comprising an ADC calibration circuit configured to calibrate for a gain error and a timing offset of the ADC to provide a first input signal for the first equalizer.

15. The system of claim 12, wherein the second equalizer comprises a decision-feedback equalizer (DFE) and is configured to remove the ISI that is added by the RX-FFE, and wherein the system further comprises an interpolator configured to adjust a phase angle of an output signal of one of the first equalizer or an RX-FFE coupled to the reflection canceller.

16. The system of claim 12, wherein the reflection canceller comprises one or more reflection cancellation stages, and wherein each reflection cancellation stage of the one or more reflection cancellation stages comprises a Q-FIR filter, a delay-match circuit and a summing circuit.

17. The system of claim 12, wherein the reflection canceller comprises a quantizer and a finite impulse-response filter.

18. A serializer deserializer (SERDES) receiver comprising:
a first feed-forward equalizer (FFE) configured to equalize channel dispersion associated with a transmission medium;
a filter configured to reduce effects of a channel reflection associated with the transmission medium;
a decision-feedback equalizer (DFE) configured to remove inter-symbol interference added by a receiver (RX)-FFE;
a second FFE coupled to the filter, and
an interpolator coupled to one of the first FFE or the second FFE, wherein the transmission medium comprises a SERDES transmission medium.

19. The SERDES receiver of claim 18, wherein the filter comprises one or more reflection cancellation stages, and wherein each reflection cancellation stage of the one or more reflection cancellation stages comprises a quantizer-finite impulse-response (Q-FIR) filter, a delay-match circuit and a summing circuit.

20. The SERDES receiver of claim 18, further comprising a phase detector configured to detect a phase angle signal from an output signal of the first FFE.

* * * * *